United States Patent
Frankowsky et al.

(10) Patent No.: US 6,714,418 B2
(45) Date of Patent: Mar. 30, 2004

(54) METHOD FOR PRODUCING AN ELECTRONIC COMPONENT HAVING A PLURALITY OF CHIPS THAT ARE STACKED ONE ABOVE THE OTHER AND CONTACT-CONNECTED TO ONE ANOTHER

(75) Inventors: Gerd Frankowsky, Hoehenkirchen-Siegertsbrunn (DE); Harry Hedler, Germering (DE); Roland Irsigler, Munich (DE); Thorsten Meyer, Dresden (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/285,924

(22) Filed: Nov. 1, 2002

(65) Prior Publication Data

US 2003/0112610 A1 Jun. 19, 2003

(30) Foreign Application Priority Data

Nov. 2, 2001 (DE) .......................... 101 53 609

(51) Int. Cl.$^7$ ............................ H05K 7/02; H05K 1/14; H01L 23/18
(52) U.S. Cl. ................. 361/735; 361/728; 361/729; 361/784; 361/790; 257/686
(58) Field of Search ............... 361/728, 729, 361/735, 736, 784, 790, 715, 731; 257/686

(56) References Cited

U.S. PATENT DOCUMENTS

| | | | |
|---|---|---|---|
| 3,579,056 A | | 5/1971 | TeVelde et al. |
| 5,111,278 A | | 5/1992 | Eichelberger |
| 5,128,831 A | * | 7/1992 | Fox, III et al. ............. 361/396 |
| 5,324,687 A | | 6/1994 | Wojnarowski |
| 5,434,745 A | * | 7/1995 | Shokrgozar et al. ........ 361/735 |
| 5,455,455 A | | 10/1995 | Badehi |
| 5,563,084 A | | 10/1996 | Ramm et al. |
| 5,841,638 A | * | 11/1998 | Purdom et al. ............. 361/790 |
| 5,857,858 A | * | 1/1999 | Gorowitz et al. ............. 439/86 |
| 6,117,704 A | | 9/2000 | Yamaguchi et al. |
| 6,222,265 B1 | * | 4/2001 | Akram et al. ................ 257/723 |
| 6,225,688 B1 | * | 5/2001 | Kim et al. ................... 257/686 |
| 6,281,577 B1 | * | 8/2001 | Oppermann et al. ........ 257/724 |
| 6,287,892 B1 | * | 9/2001 | Takahashi et al. .......... 438/107 |
| 6,560,109 B2 | * | 5/2003 | Yamaguchi et al. ........ 361/704 |
| 6,563,217 B2 | * | 5/2003 | Corisis et al. ............... 257/738 |
| 6,583,503 B2 | * | 6/2003 | Akram et al. ................ 257/686 |

FOREIGN PATENT DOCUMENTS

| | | |
|---|---|---|
| DE | 44 33 845 | 3/1996 |
| EP | 0 611 129 | 8/1994 |

* cited by examiner

Primary Examiner—David Martin
Assistant Examiner—Dameon E. Levi
(74) Attorney, Agent, or Firm—Schiff Hardin LLP

(57) ABSTRACT

An electronic component has a plurality of chips which are stacked one above the other and contact-connected to one another. To form this component, a first planar chip arrangement is provided with the functional chips spaced apart from one another in a grid and with a filling material in the spaces between the chips to form an insulating holding frame that fixes the chips, the frame has chip-dedicated contact-connecting elements that serve for the electrical contact-connection to another chip of another chip arrangement and each chip has dedicated electrically conductive strips. At least one additional planar chip arrangement is formed by the same method as the first planar chip arrangement and is then stacked on the first planar chip arrangement so that the two chip arrangements lie one above the other and the respective contact-connecting elements of the two chip arrangements are connected to one another for electrical chip-to-chip contact-connection. Subsequently, each of the components, which comprise a stack of chips, is separated from the assembled stack of chip arrangements.

26 Claims, 14 Drawing Sheets

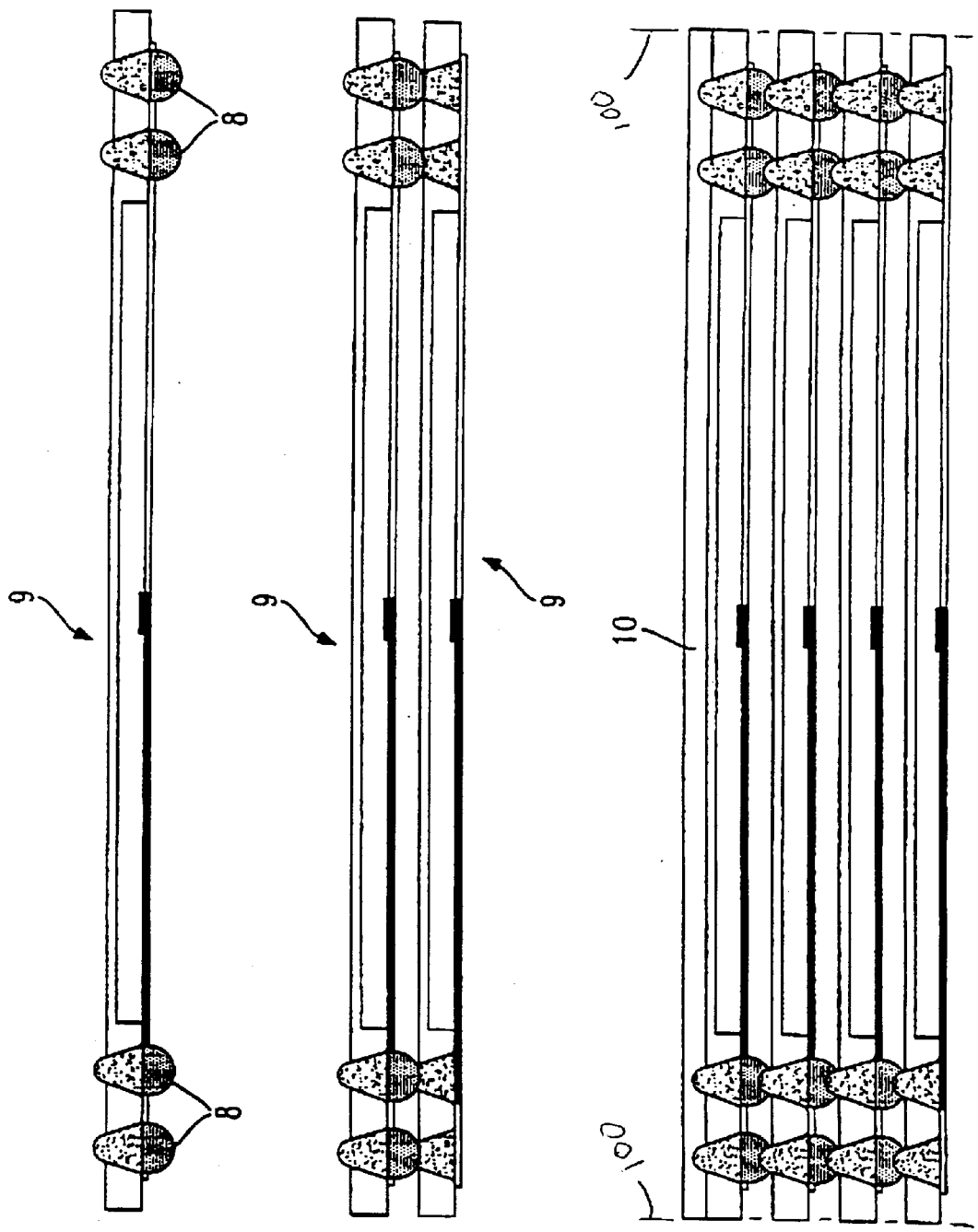

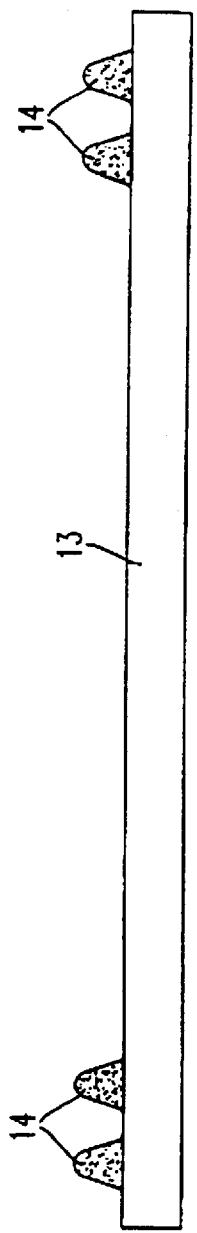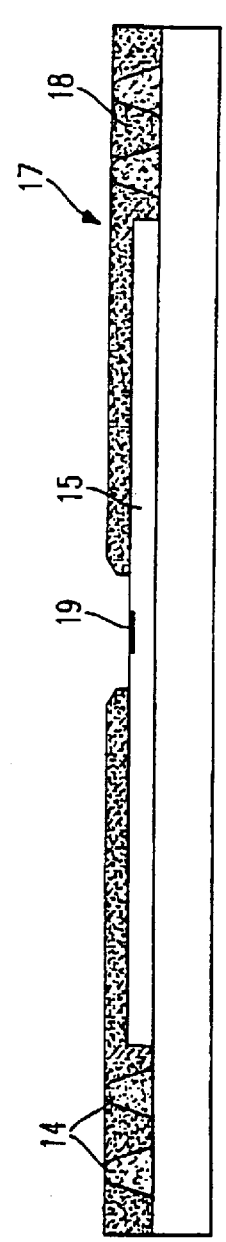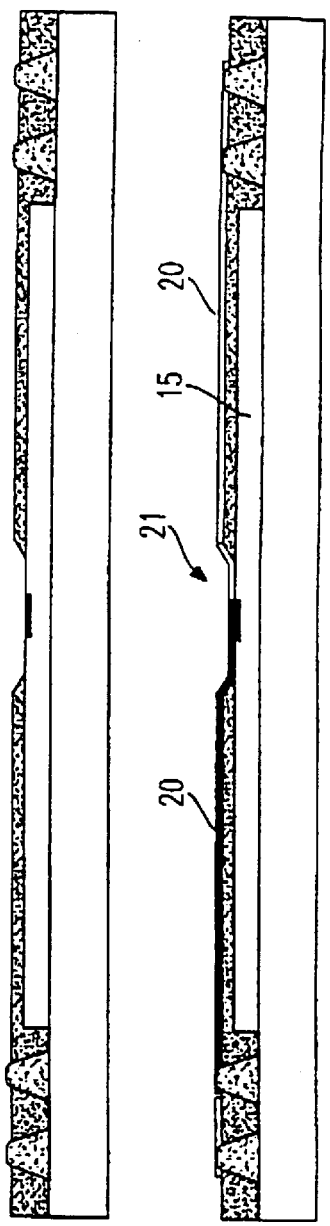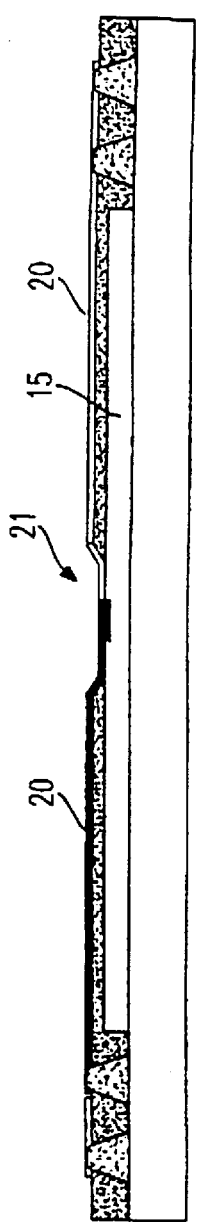
FIG 2a
FIG 2b
FIG 2c
FIG 2d
FIG 2e

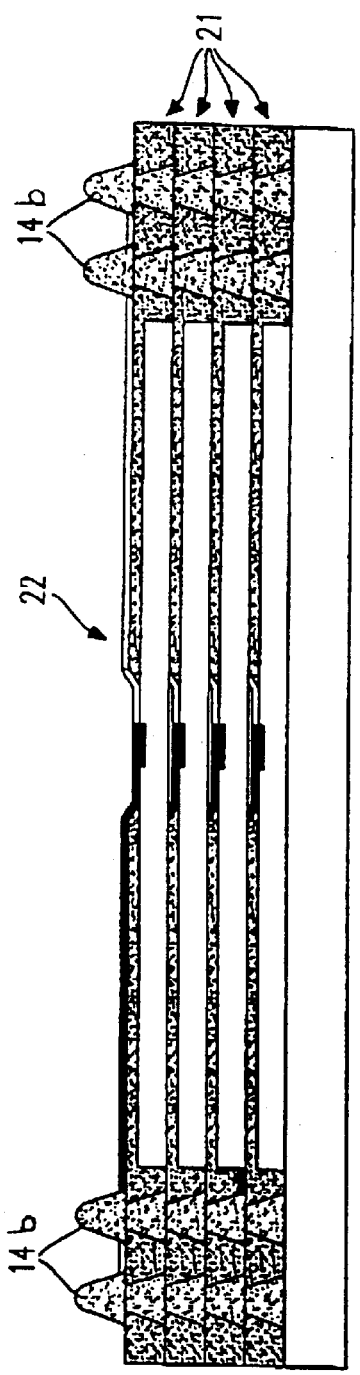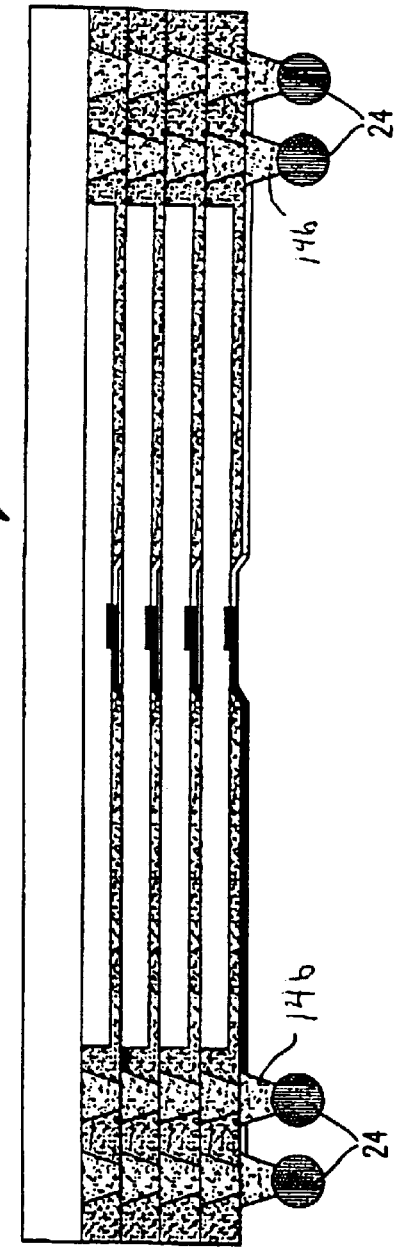
FIG 2j
FIG 2k

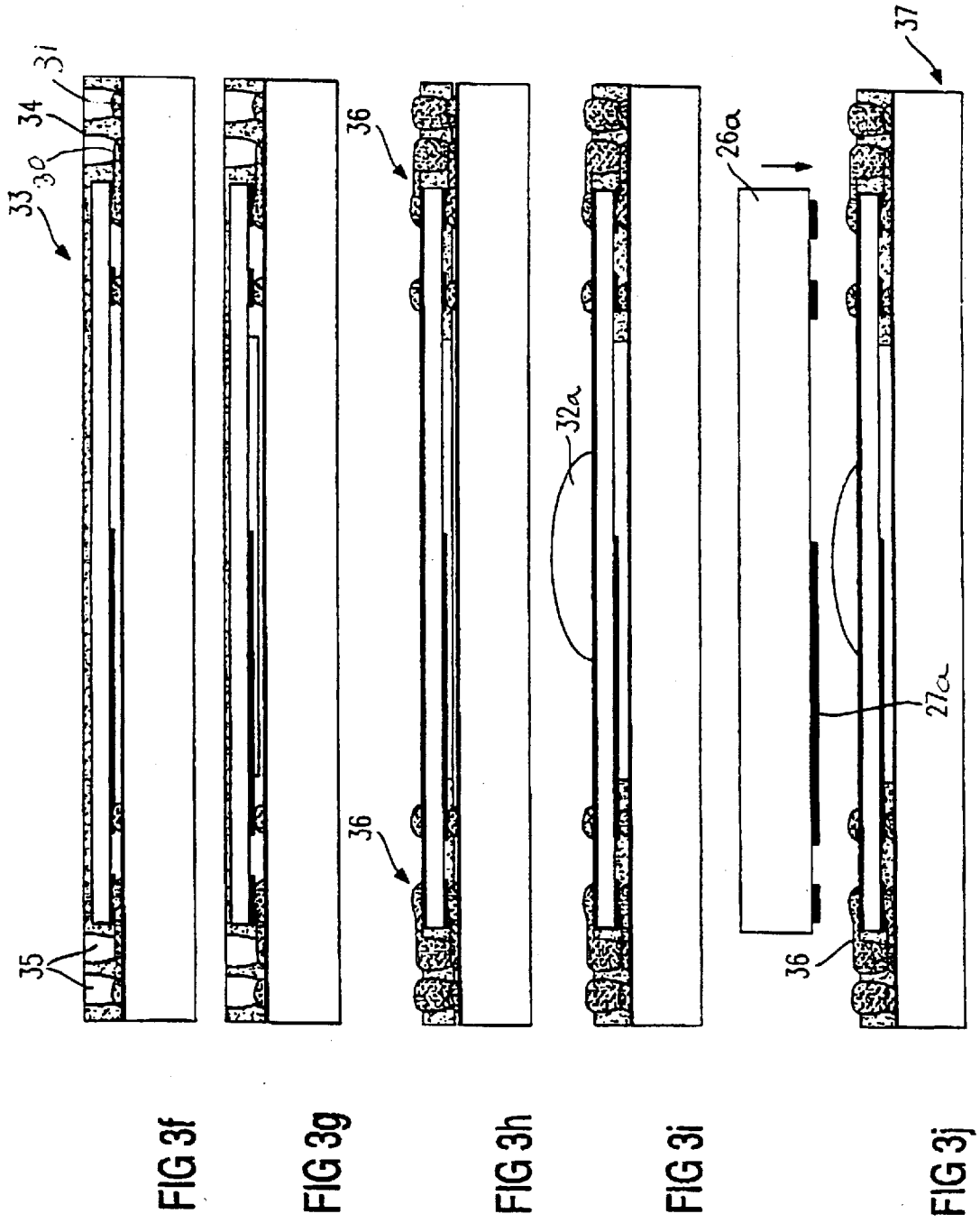

US 6,714,418 B2

METHOD FOR PRODUCING AN ELECTRONIC COMPONENT HAVING A PLURALITY OF CHIPS THAT ARE STACKED ONE ABOVE THE OTHER AND CONTACT-CONNECTED TO ONE ANOTHER

BACKGROUND OF THE INVENTION

The invention relates to a method for producing an electronic component with a plurality of chips that are stacked one above the other and contact-connected to one another, which component can be mounted on a component carrier and can be contact-connected on the component carrier via a plurality of contact elements provided on the component.

Known methods for producing a component with a plurality of chips that are stacked one above the other into the third dimension can roughly be divided into two groups. One group is the stacking of housed chips, and the other group is the stacking of bare chips. When stacking housed chips, the latter are stacked one above the other and connected to one another by their contact elements, which may be small legs. Examples thereof are stacked TSOP or stacked BOC. These three-dimensional designs are distinguished by so-called interposers, which are thin or thick boards or leadframes, for connection between the stack planes. These interposers are mounted onto the chips and connected to the chip-side contact elements by suitable methods. This method is expensive on account of its mounting outlay, since it is based on a single-die process flow, for example, exclusively separate individual housed chips are processed. On account of the interposers that are necessary in part, the resulting components are of considerable structural height. It is not possible to thin down the chips during the stacking process on account of the housing that has already been effected.

By contrast, a component produced by stacking bare chips enables a smaller construction height. The chip-to-chip connection system leads through the respective chip. The fine contact-connecting vias required for this are usually produced in a front-end-like process, which includes via etching/passivation/via filling. However, this method has crucial disadvantages for the application. On the one hand, it presupposes a particular chip design which allows the production of contact-connecting or through vias. The vias are very expensive to produce since they have to be produced in an additional, relatively long process sequence of front-end processes. Although the essential processes can be carried out at the wafer level, difficulties with regard to the yield nonetheless arise when stacking bare chips at the wafer level. Since each wafer only has a finite yield of functioning chips, when stacking the wafers the risk is exponentiated for a functioning stack, and the yield decreases exponentially with an increasing number of stacked wafers. Economic component production by this method is not possible.

SUMMARY OF THE INVENTION

The invention is based on a task of providing a method which makes it possible to produce components of relatively low construction with a high yield in a simple manner.

In order to solve this task, the invention provides a method of the type mentioned in the introduction having the following steps:

a) producing a first planar chip arrangement by arrangement of functional chips spaced apart from one another in a grid and filling at least the spacings between the chips with a filling agent for the purpose of forming an insulating holding frame that fixes the chips with chip-dedicated contact-connecting elements that serve for the electrical contact-connection to another chip of another chip arrangement and are provided in the region of the holding frame, and chip-dedicated rewiring, b) producing and/or arranging of a further planar chip arrangement according to step a) on the first chip arrangement in such a way that the chips and the holding frames of the two chip arrangements lie one above the other and the respective contact-connecting elements of the two chip arrangements are connected to one another for the electrical chip-to-chip contact-connection to form joined-together components, c) if appropriate single or multiple repetition of step b), and d) separating the joined-together components each comprising a plurality of chips of the individual chip arrangements, which chips are stacked one above the other, by separation of the holding frames of the chip arrangements that are fixedly connected to one another.

The method according to the invention firstly proposes the production of a wafer comprising exclusively chips that have been tested as functional in a previous test. This so-called "known good wafer" is produced by positioning the chips in a grid fashion and correspondingly embedding said chips in an insulating holding frame, which is preferably produced by means of a viscous non-conductive polymer used as a filling agent. In this case, it is conceivable to integrate into this wafer either identical chips or else different chips which differ in their properties and/or dimensions. This wafer or this first planar chip arrangement is thus produced by a fan-out wafer-level packaging. This holding frame for the fan-out wafer-level packaging is now not only utilized for fan-out, rather it also serves to form the through-platings from the chip front side to the chip rear side i.e. the through-plating is displaced to the holding frame region. Afterward, a further chip arrangement is then produced in this way, that is to say stacked on, the chips and the holding frames being positioned congruently above one another, if the multichip stack is constructed from identical or identically sized chips. However, it is also possible to arrange different or differently sized chips in the individual planes, in which case the congruent stacking one above the other is not always possible on account of the differences in size. The abovementioned step is repeated as many times as separate chip layers are to be provided. Once all the chip layers have been stacked one above the other, the individual components are singulated by separation of the stack in the region of the holding frame.

The method according to the invention has appreciable advantages over the known methods. First, it is a complete wafer-level process, since the work is effected at the wafer level and the singulation is carried out only after the components have been produced in their entirety by formation of the stack. Since exclusively functional chips are used, the yield is very high. All standard chips can be used, and it is possible to integrate identical or different chips in each plane. Furthermore, it is a very cost-effective process, since the contact vias for the contact-connections do not have to be led through the conductive silicon crystal with expensive technology, but rather through the holding frame, which can be carried out using significantly simpler thin-film and/or thick-film processes. Furthermore, a process sequence which can be carried out at very low process temperatures of less than 150° C. is. involved, which does not result in additional loading on the chips. Moreover, the stacking of the chips or wafers, which are de facto bare, permits the production of components with an extremely small structural height, and results in a very low risk with regard to handling and breakage during production.

The method according to the invention makes it possible to construct a multichip arrangement without the mounting of an additional object, for example an interposer. Rather, in this case the chip arrangements are placed or constructed directly on top of one another. The wiring of the chips is effected directly at the wafer level, which is to say directly in the plane of the wafer, and the wiring strip or conductive paths can be processed using wafer level technology, which includes thin film/thick film. This is made possible by the holding frame which in each case surrounds a chip and serves as a contact-connecting region, for example, the electrical chip-to-chip contact-connection and also the connection to the module board is effected in the region of the holding frame. In addition to a minimum of required contact transitions, both mechanical and above all electrical, a multichip component produced in this way is also distinguished by its low structural height and the small lateral dimensions.

In a development of the concept of the invention, it may be provided that at least the first chip arrangement is produced using a carrier to which the chips are fixed by means of an adhesive. In this case, a self-adhesive film or a self-adhesive tape may be used as the carrier; and, as an alternative, the use of a silicon carrier that is preferably passivated at its surface is also conceivable.

A first invention alternative is distinguished by the fact that the individual chip arrangements are produced separately and subsequently connected to one another. In other words, each individual chip arrangement is produced in the form of a separate known good wafer with the chip grid and the holding frame, these individual chip arrangements only being stacked one above the other and connected to one another after their production. In this case, a separate chip arrangement may be produced for example by the following steps:

application of the contact-connecting elements to the carrier at predetermined positions, fixing of the chips on the carrier, production of the insulating holding frame, removal of the carrier, production of the wiring strips or conductive paths, provision of connecting adhesive points, two chip arrangements subsequently being connected to one another by means of the connecting adhesive points.

The carrier thus initially serves as a stabilization element to which the contact-connecting elements are applied and then the chip is positioned and the holding frame is produced. Afterward, the carrier can be removed, since the known good wafer that is then already partly finished is sufficiently stable. Finally, the rewiring is produced and the connecting adhesive points made principally of conductive adhesive are provided, and after which two chip arrangements are connected to one another. In this case, the thickness of the holding frame is expediently dimensioned so that the contact-connecting elements protrude from the holding frame. The filling agent for the purpose of forming the holding frame should expediently also at least partially cover the chips at their free side with formation of a protective layer, for example, the chips are expediently completely cast into the filling agent at their free side facing away from the carrier. The chips themselves are fixed on the carrier, that is to say the adhesive tape, for example, with their contact-connecting side, to which the wiring strips or rewiring is to be applied, and the wiring strip is applied on this side after the removal of the carrier.

A conductive adhesive is expediently used as the connecting adhesive with which the connecting adhesive points are formed. The conductive adhesive is applied to the contact-connecting elements that are uncovered at the side freed of the carrier and extends on the freed side in a planar manner with the holding frame and the contact-connecting side of the chip. Finally, after the end of the stacking operation, a protective coating is applied to the upper chip arrangement.

As described, this method is distinguished by the fact that the individual chip arrangements are produced separately in the form of individual wafers and then these wafers are connected and contact-connected to one another. By contrast, an alternative configuration of the invention provides for a further chip arrangement to be constructed on a chip arrangement that is already present. Each new chip layer/wafer layer is thus mounted on an already existing, solid, thick, stable chip arrangement, which is advantageous particularly for the handling of the stack that is becoming thicker and thicker.

According to the invention, an additional chip arrangement which is constructed on one that is already present can be produced by the following steps:

producing additional contact-connecting elements of the additional chip arrangement on the contact-connecting elements of the lower chip arrangement that are uncovered on the top side, applying the chips of the additional chip arrangement above and preferably congruently with the chips of the lower chip arrangement, producing the insulating holding frame in such a way that the contact-connecting elements still protrude from the chip and the filling agent covers the chips on the top side except for the chip-side contact pads as insulation layer, producing the conductive paths or strips, the steps being repeated as many times as chip arrangements are to be stacked one above the other.

As a result of the production of the respective additional contact-connecting elements, the through-platings are realized from top to bottom. Afterward, the chips are positioned in the predetermined grid and the holding frame is produced. In this case, the filling agent is introduced in such a way that it insulates the chips on the top side except for the chip-side contact pads, which is necessary for the subsequent production of the rewiring.

In this case, the first chip arrangement, that is to say the bottommost arrangement, onto which an additional or second chip arrangement is constructed, can be produced by the following steps:

producing the contact-connecting elements of the first chip arrangement on the carrier, in particular a silicon carrier, applying the chips of the first chip arrangement, producing the insulating holding frame in such a way that the contact-connecting elements still protrude from the holding frame and the filling agent covers the chips on the top side except for the chip-dedicated contact pads as insulation layer, producing the wiring or conductive paths.

It is expedient if, after the production of the holding frame including the frame section that partially covers the chips, a cleaning step that uniformly removes the filling material is carried out, a planar area thereby being produced, which is advantageous for the subsequent production of the rewiring or conductive paths. Furthermore, the total structural height becomes somewhat thinner.

As an alternative to the production of the first and each additional chip arrangement of the type described above, in the case of a construction of a chip arrangement on one that is already present, a second method variant provides for the first chip arrangement and also each additional chip arrangement to be produced by the following steps:

a) producing rewiring or conductive tracks with contact-connecting points on a carrier, in particular a preferably passivated silicon carrier, b) fixing the chips that are already provided with a rewiring or conductive strip with their side that has the rewiring or strip pointing toward the carrier, so that the rewiring of the chips is connected to the rewiring tracks of the carrier, c) producing the holding frame in such a way that the chips are also embedded in the filling agent at their free side, contact vias for through-plating to the underlying contact-connecting points being formed in the holding frame, d) producing additional rewiring or conductive tracks with contact-connecting points and elements which fill the contact vias, after which steps a) to d) are repeated in order to form one or a plurality of additional chip arrangements.

Thus, in this configuration of the invention, chips are applied to the carrier or an already existing chip arrangement, which are already provided with a rewiring. Rewiring or conductive tracks, which, on the one hand, are contact-connected by a chip to be emplaced and which,-on the other hand, run into the region of the holding frame, are produced only on the carrier or a lower chip arrangement.

After the fixing of the chips, chip material may advantageously be removed for the purpose of reducing the thickness. For example, the thickness of a chip and thus the total structural height of the resulting component are actively reduced here. The chip material may be removed by wet or dry etching or by mechanical treatment.

The chips themselves are fixed by means of a non-conductive adhesive, since the actual contact-connection is effected by means of the rewiring tracks and the contact-connecting points and elements by means of the contact vias. After the production of the last chip arrangement, contact elements for contact-connecting the components that are subsequently to be singulated or separated from a carrier are produced at the top side of said chip arrangement. This applies to both method embodiments in which a chip arrangement is constructed on an already existing chip arrangement.

While the previous embodiments of the method according to the invention provide contact-connecting elements which penetrate through the holding frame for the purpose of contact-connecting the rewiring tracks of two chip planes, it is also possible, however, in principle for the rewiring tracks to be directly contact-connected to one another. A first embodiment constituting a quasi-direct contact-connection is the above-described method variant in which contact vias are formed in the holding frame and are then filled directly during the production of the rewiring tracks. For example, the rewiring tracks and their contacts in the contact vias to the underlying rewiring plane are produced jointly.

By contrast, an embodiment which enables a direct rewiring contact of two planes provides the following steps:

a) arranging the chips on a carrier, b) producing the holding frame in such a way that the chips are temporarily embedded in the filling agent and at their free sides except for a region that leaves the contact pads free, c) producing rewiring tracks which extend right into the region of the holding frame sections situated between the chips and the ends of the rewiring tracks that are positioned in this way, forming the contact elements to the chip arrangement that is subsequently to be constructed or arranged, d) applying a non-conductive adhesive for fixing the chips of the second chip arrangement and for insulating the underlying rewiring tracks in such a way that the contact elements of the first chip arrangement are uncovered, and applying the chips of the second chip arrangement, e) applying a non-conductive additional filling agent for the purpose of forming a holding frame in such a way that it covers the chips laterally and on the top side except for the region of the contact-connecting pads with the contact elements of the first chip arrangement still remaining free, f) producing the rewiring or conductive tracks of the second chip arrangement, which are contact-connected at the ends to the contact elements of the first chip arrangement, and g) if appropriate, single or multiple repetition of steps d) to f).

Thus, in this configuration of the invention, the ends of the rewiring tracks themselves serve as contact elements to the respectively adjacent rewiring plane. In this case, the individual holding frames of the chips of a second chip arrangement are dimensioned in such a way that although they largely embed the chip, they do not cover the ends of the rewiring tracks of the underlying chip plane. The rewiring tracks of the second chip arrangement then run on the holding frame laterally into the underlying plane, where they are directly connected to the rewiring tracks which end there.

The contact-connecting elements and also the rewiring tracks and the contact-connecting points thereof are expediently produced from a conductive polymer. They are preferably printed on.

As described, a non-conductive polymer is expediently used as the filling agent, which polymer is printed on, sprayed on or spun on. Generally, after the production of the holding frame, in particular if the latter has a section covering a chip, a step for reducing the thickness of the filling agent whilst at the same time leveling the area can be carried out.

In addition to the method, the invention furthermore relates to an electronic component with a plurality of stacked chips which is produced according to one of the described method variants.

Furthermore, the invention quite generally relates to an electronic component with a plurality of stacked chips, each chip having dedicated rewiring or conductive tracks. The component according to the invention is distinguished by the fact that each chip is accommodated in a holding frame which surrounds it at least laterally. The rewiring tracks of chips lie one above the other, which rewiring tracks run right into the region of the holding frame, and are contact-connected to one another in the region of the holding frame.

In the case of the component according to the invention, the electrical chip-to-chip contact-connection or ultimately also the contact-connection to the module board onto which a finished processed chip is placed is advantageously effected in the region of the holding frame to which the rewiring or conductive tracks are led from the central contact pads of a chip. The holding frame provided according to the invention thus affords the required lateral region in order to enable a contact-connection that is drawn outward. Consequently, in the case of the component according to the invention, there is no need whatsoever for objects placed between two chips, such as, for example, interposers or the like, rather the chips can be stacked virtually directly one above the other. The rewiring or conductive strip between two chips is thus effected directly, the rewiring of an individual chip running from the central contact pads to the holding frame virtually in the chip plane. What is achieved in this way is an element with a minimum of, in particular, electrical contact transitions on account of avoiding the interposition of additional interposers or the like.

In this case, the rewiring or conductive tracks may be connected to one another by means of contact elements. These contact elements, as through-plating elements, supply the contact through a holding frame from the rewiring track of a first chip to the rewiring track of a second chip. In this case, the contact elements of a first chip and the rewiring track of a second chip may be connected to one another directly or by means of a conductive adhesive.

As an alternative to this, it is also possible for the rewiring tracks to be directly connected to one another, that is to say without a contact element effecting through-plating through the holding frame. This can be done in such a way that the rewiring tracks of a chip are led laterally to the plane of the overlying or underlying chip and are contact-connected there on the rewiring tracks of this chip plane. It is also possible for the rewiring tracks to be connected to one another by means of a conductive adhesive.

Overall, the component construction according to the invention affords the possibility of working without interposers or the like that are to be positioned between the individual chip planes. Furthermore, a component with a very small construction height can be produced on account of the chips being stacked directly one above the other. This also applies with regard to the lateral extents, since likewise relatively little space is required for the respective holding frame and the contacts provided there.

The contact elements and the rewiring or conductive tracks themselves are expediently made of a conductive polymer and can be produced using known technologies. It is furthermore expedient if the holding frame at least partially covers a chip both laterally and at one of its flat sides. A protective coating which is provided on the topmost chip and which, if appropriate, also laterally covers the lower chips is also expedient.

Further advantages, features and details of the invention emerge from the exemplary embodiments described below.

BRIEF DESCRIPTION OF THE DRAWINGS

FIGS. 1a–1j show the individual method steps for producing a component by producing individual separate chip arrangements which are connected to one another;

FIGS. 2a–2l show the individual method steps for producing a component in which a chip arrangement is constructed on an already existing chip arrangement;

DESCRIPTION OF THE PREFERRED EMBODIMENTS

FIGS. 1a–1j essentially show the method steps for producing separate chip arrangements in the form of known good wafers, which are then stacked one above the other and contact-connected to one another and subsequently separated.

Figure 1A:
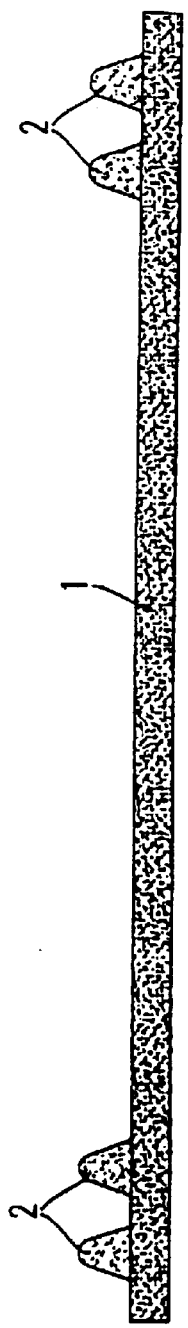

Proceeding from a carrier 1 shown in FIG. 1a, which carrier may be, for example, a conductive elastic polymer, for example conductive silicone in the form of a tape or a film, through-plating elements 2 are applied thereto, preferably printed onto it. The elements 2 expediently are made likewise of a conductive polymer. It should already be pointed out at this early juncture that all the illustrations of all the figures show merely a detail from a chip arrangement with only one chip. The chip arrangement continues, of course, laterally. A chip arrangement or a known good wafer is expediently produced in customary wafer dimensions, for example with a diameter of 30 cm, for which reason an arbitrarily large number of chips can be arranged depending on the respective size of an individual chip and the grid chosen.

Figure 1B:
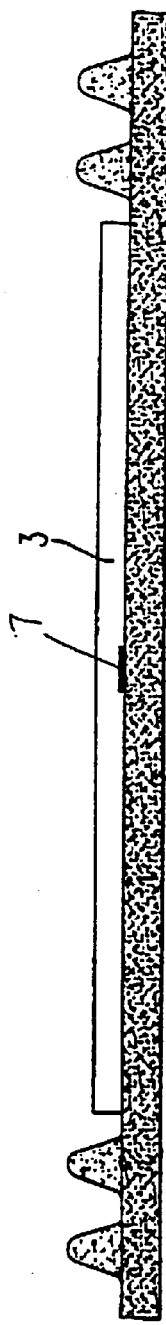
Figure 1C:
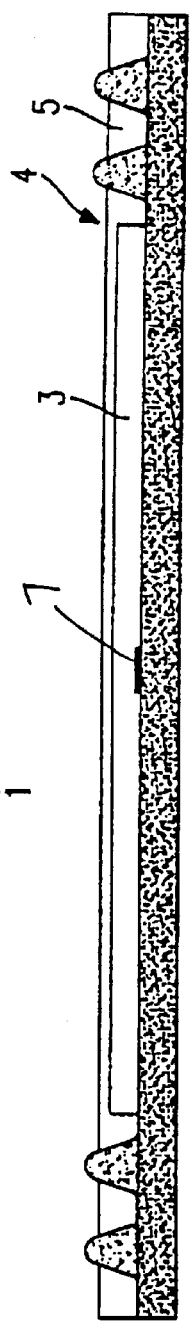
Figure 1D:

According to FIG. 1b, a chip 3 tested as functional in a previous test is placed with its contact-connecting side, which has a contact pad 7 being directed toward the carrier 1, and then adhesively bonded onto the carrier 1, which is preferably self-adhesive at its top side. It is clearly placed between the through-plating elements 2. According to FIG. 1c, a holding frame 4 is produced using an insulating filling agent 5, and this can be done by printing on, flushing on or spinning on the viscous filling agent 5. In this case, the thickness of the holding frame is dimensioned so that, on the one hand, the through-plating elements 2 still protrude from it, but, on the other hand, the free side of the chip 3 is covered, so that a protective layer is formed above the chip. After the filling agent has been applied and cured, it is preferably cleaned in a plasma cleaning step or a wet or dry cleaning step and removed somewhat, if necessary. After the curing of the filling agent 5, a sufficiently stable chip arrangement is already produced, so that, according to FIG. 1d, the carrier 1 can be removed, for example the tape is stripped away in a simple manner.

Figure 1E:
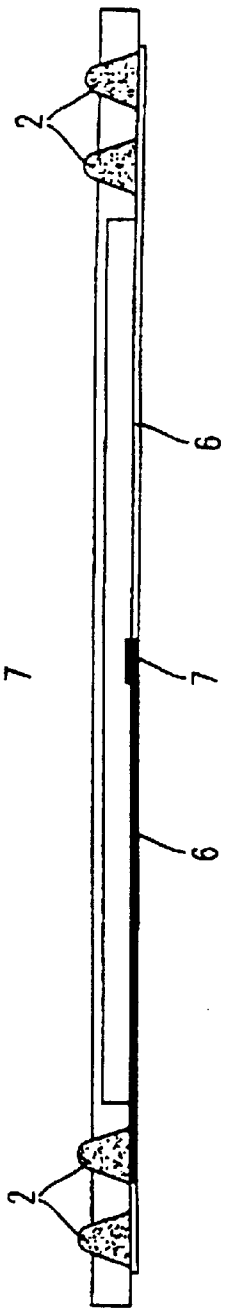

According to FIG. 1e, a metallic rewiring or conductive track or strip 6 is then produced at the side freed of the carrier. This rewiring connects the now uncovered contact pads 7 provided at the chip to the respective through-plating elements 2. The production of this rewiring can be produced by sputtering or plating a metal layer on the exposed side, which layer is subsequently shaped using lithography and a subsequent etching process. A more detailed discussion thereof is not necessary since methods for producing the rewiring or conductive strips are sufficiently known to the person skilled in the art.

According to FIG. 1f, a connecting adhesive 8 is then applied in a point form to the uncovered through-plating elements at the contact-connecting side. The chip arrangement 9 produced in this way, is then conductively connected (see FIG. 1g) to a second chip arrangement 9, which has been produced in the same way, by means of these connecting adhesive points 8. These conductive connecting adhesive points 8 are principally made of conductive silicone, which is cured after the connection of the chip arrangements

9. As many chip arrangements 9 as desired can be adhesively bonded and contact-connected to one another in order to form a stack. FIG. 1h shows a total of 4 separate chip arrangements 9 with a protective covering 10, principally also made of a non-conductive polymer, being applied to the rear side of the topmost chip arrangement 9 in accordance with FIG. 1h.

The stack comprising a total of four separate chip arrangements 9 formed in this way has thus been constructed to completion. The entire construction has been effected in the context of a fan-out wafer-level packaging.

Figures 1I, 1J:
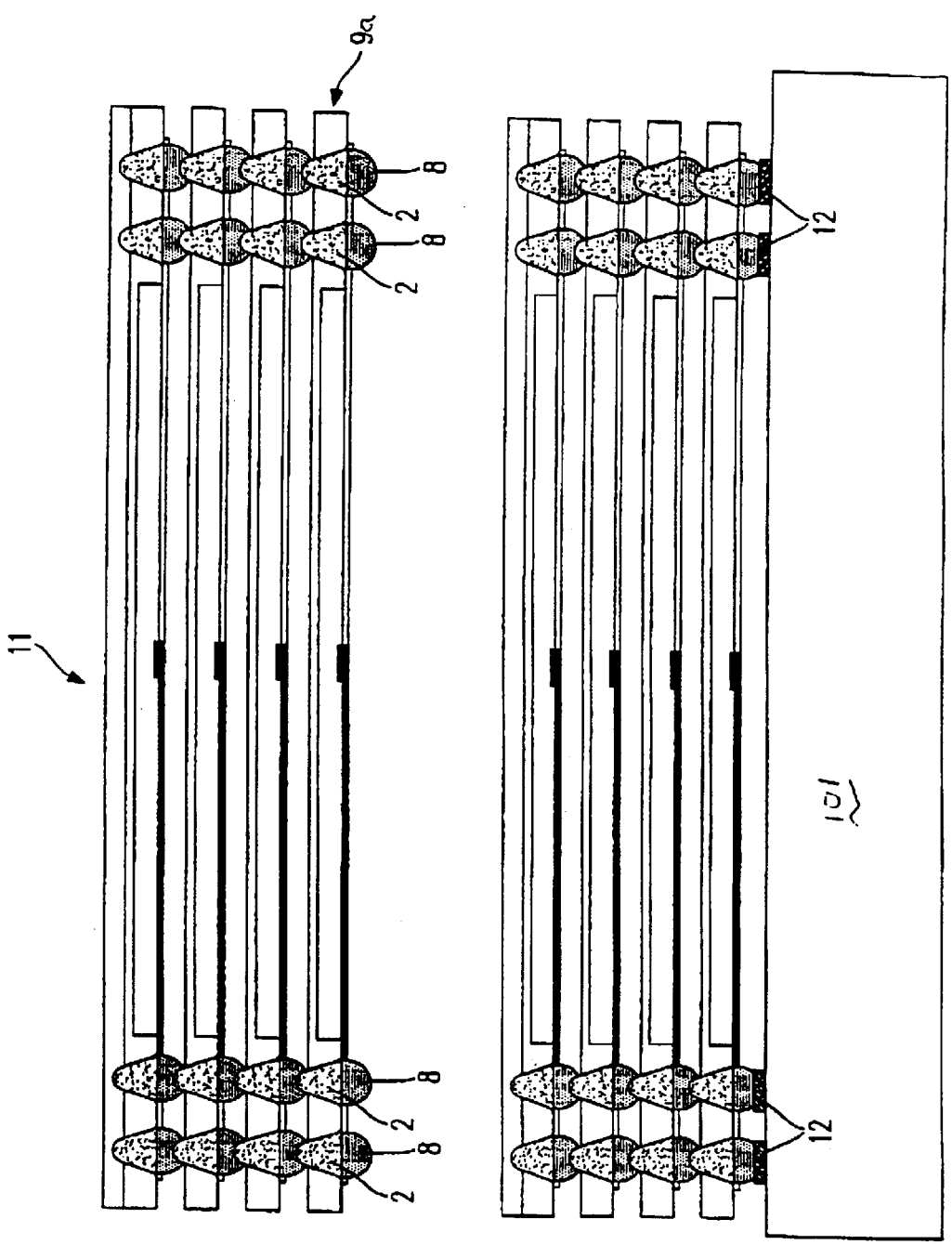

After the step in accordance with FIG. 1h has been carried out, the individual components 11 are then separated, for which purpose the holding frame is separated, and preferably is sawed apart, such as by cutting along lines 100. FIG. 1i shows such a separated component 11. As shown in FIG. 1i, after the separation, additional connecting adhesive points 8 made of a conductive adhesive, for example conductive silicone, are applied to the through-plating elements 2 which are uncovered at the contact-connecting side of the lower chip arrangement 9a, after which, see FIG. 1j, the component 11 is adhesively bonded onto, and contact-connected to, a component carrier 101, at whose contact-connecting side contact-connecting points or tracks 12 are already provided.

FIGS. 2a–2l show the most important method steps for producing a three-dimensional component in the fan-out wafer-level packaging, with a chip arrangement being constructed on a respective existing chip arrangement.

In order to form the first "bottommost" chip arrangement, through-plating elements 14, preferably made of conductive silicone, are first applied or principally printed on a carrier 13, for example a passivated silicon carrier. According to FIG. 2b, a chip 15 is adhesively bonded onto the carrier 13, with its contact-connecting side 16 with a contact pad 19 pointing upward, using a suitable adhesive. According to FIG. 2c, a holding frame 17 is produced using an insulating filling agent 18, for example epoxy resin or silicone. The filling agent is principally printed. In this case, the holding frame is dimensioned so that the through-plating elements 14 are not covered by it on the top side. Furthermore, the holding frame 17 largely extends over the chip 15, but it leaves the top-side contact pad 19 of the chip 15 free in the center. In the step in accordance with FIG. 2d, the surface of the holding frame 17 is cleaned for example by plasma etching or wet etching and a surface portion of the holding frame is removed somewhat. In the step according to FIG. 2e, rewirings or conductive tracks 20 are then applied to the top side of the chip 15, with the top side being partially covered with the holding frame 17. These rewirings or conductive strips 20 contact-connect the through-plating elements 14 to the contact pads 19. The rewirings 20 are produced by sputtering on or plating on a metal layer, which is subsequently shaped by lithography and a subsequent wet etching step. The first "lower" chip arrangement 21 is completed with the conclusion of the method step according to FIG. 2e.

Figure 2F:
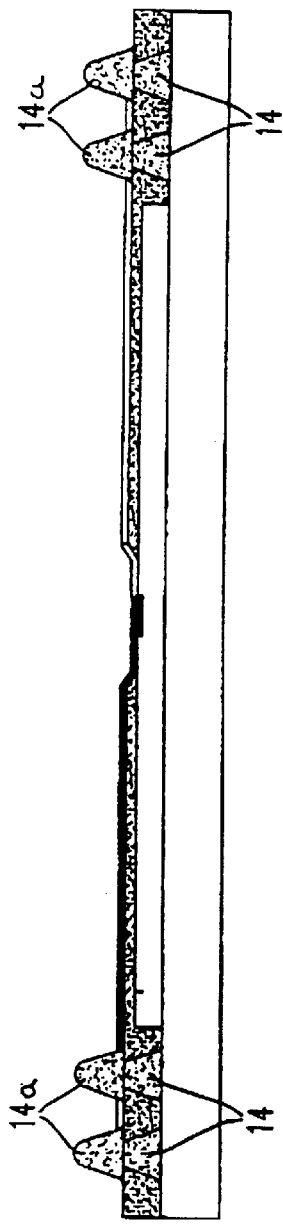
Figure 2G:
Figure 2H:
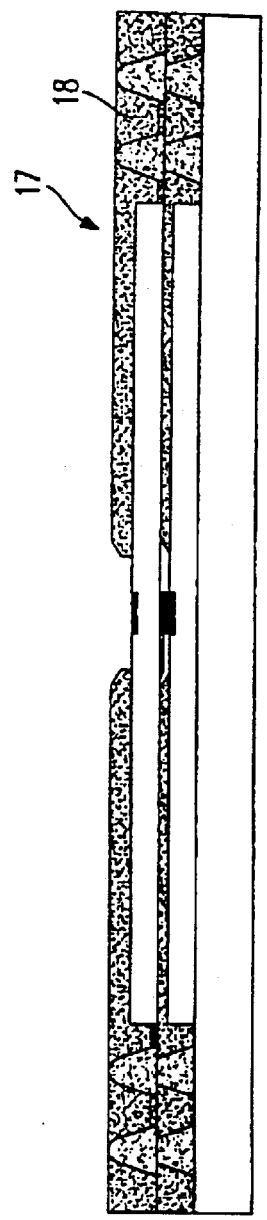
Figure 2I:
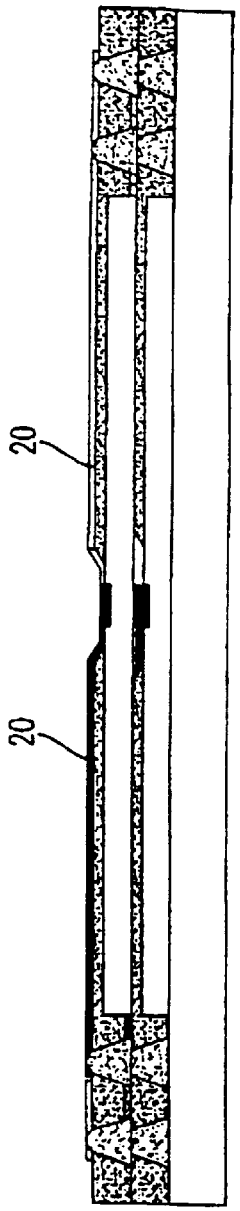
Figure 21:
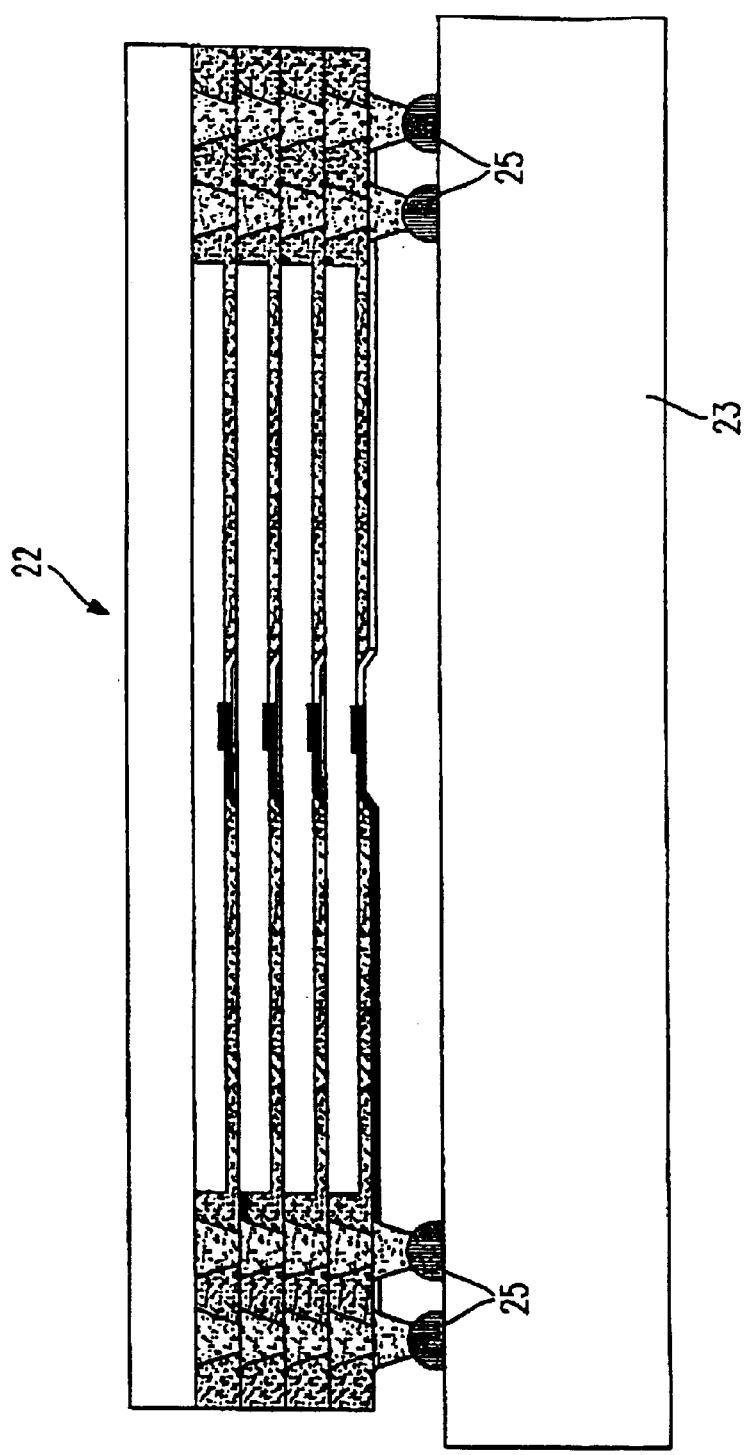

Then, as shown in FIG. 2f, additional through-plating elements 14a are applied to the lower chip arrangement 21 congruently with the through-plating elements 14 of the lower chip arrangement 21. In the step according to FIG. 2g, a second chip 15a is then placed congruently above the already present chip 15 of the first chip arrangement. The chip 15 is expediently provided with a passivation layer at its rear side, so that it is insulated from the rewiring of the lower chip arrangement 21.

In the step according to FIG. 2h once again a holding frame 17 is described using a filling agent 18 in the same way as with regard to FIG. 2c. This holding frame, too, is subsequently (see FIG. 2d) cleaned and surface portions are somewhat removed. The rewiring or conductive strips 20 of the second chip arrangement or plane are produced in the step according to FIG. 2i. This is followed in turn by the steps according to FIGS. 2f to 2i. These are repeated as many times as there are chip arrangements to be constructed. FIG. 2j shows a configuration with four chip arrangements 21, two contact-connecting elements 14b additionally being placed onto the topmost chip arrangement 21. Once the configuration has been completely constructed, the components are singulated by separation of the holding frame of all the chip arrangements 21 placed one above the other. FIG. 2j shows a singulated component 22.

For mounting the component 22 on a component carrier 23, the component is then turned over (flip-chip), connecting adhesive points 24, for example made of conductive silicone, are applied to the uncovered contact elements 14b (see FIG. 2k). By means of the connecting adhesive points 24, the component 22 is then fixed on the component carrier 23 with the through-plating elements 14 being contact-connected to carrier-side contact elements 25, as shown in FIG. 2l.

Figure 3A:
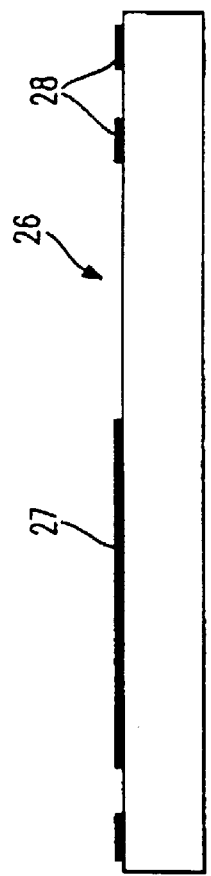
FIGS. 3a–3o show the method steps for producing a component in which a chip arrangement is constructed on an already existing chip arrangement, individual chips with rewiring already arranged being used.
Figure 3B:
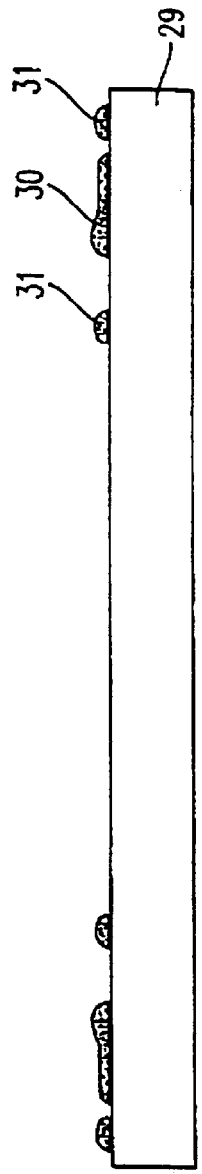
Figure 3C:
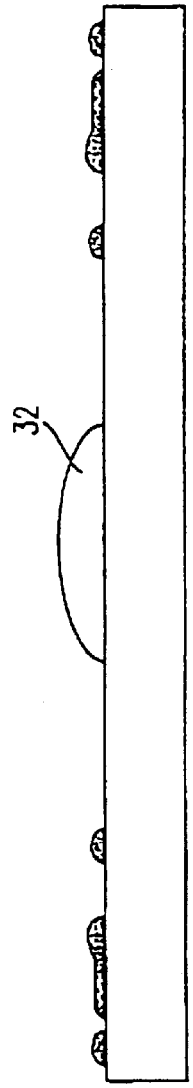
Figure 3D:
Figure 3E:
Figure 3K:
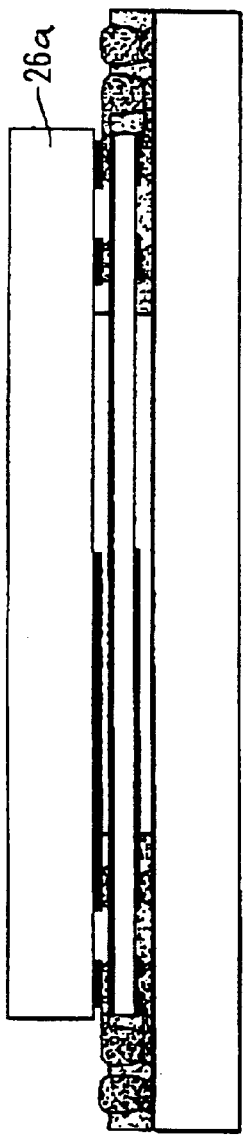
Figure 3L:
Figure 3M:
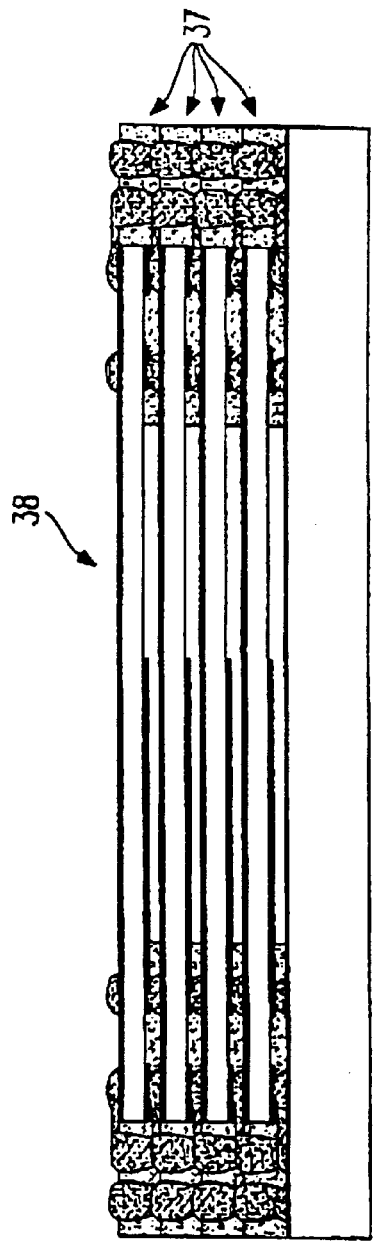
Figure 3N:
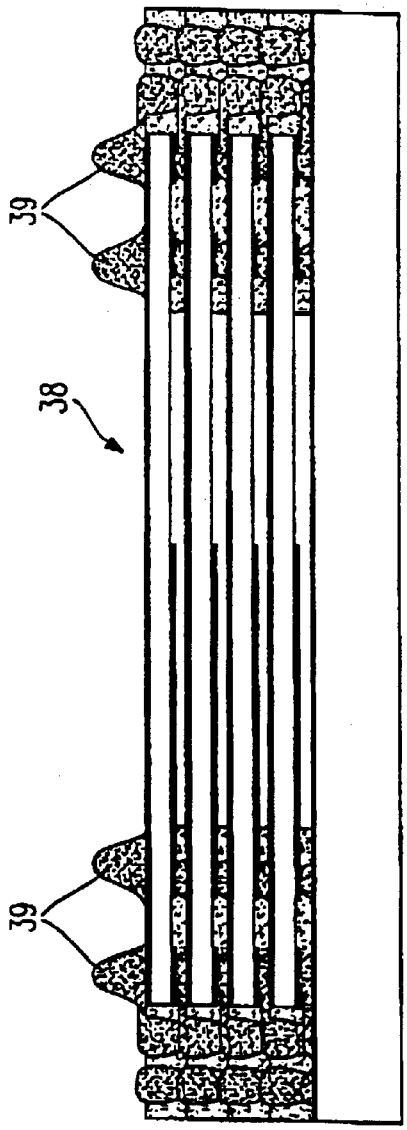
Figure 3O:
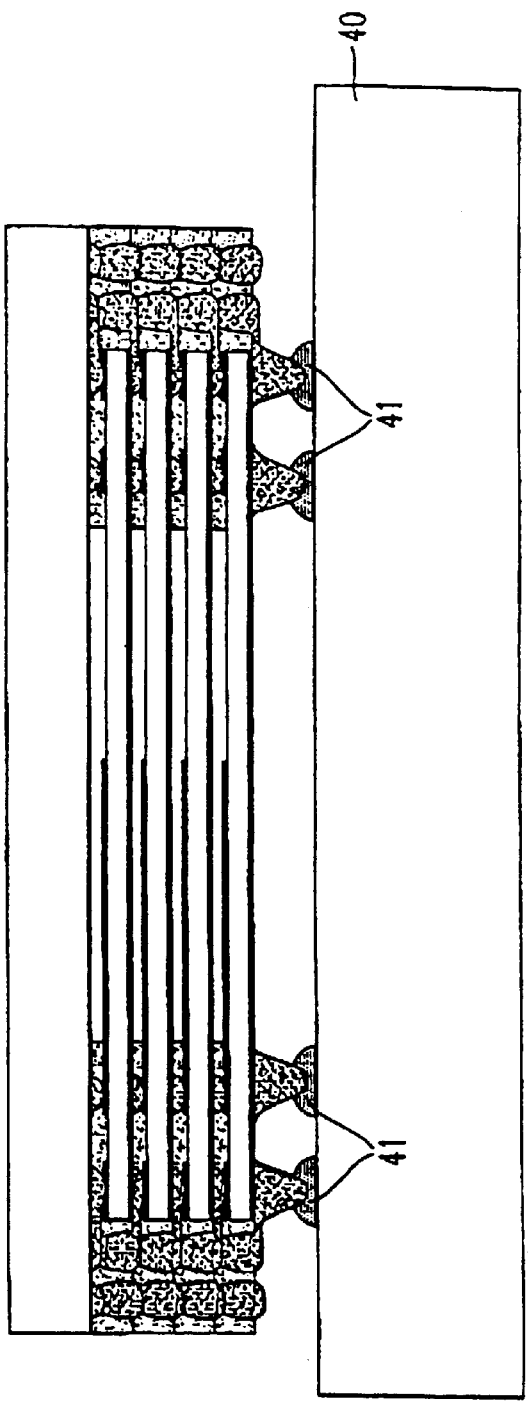

FIGS. 3a–3o show the relevant method steps for producing a component by constructing a chip arrangement on an already existing chip arrangement. Chips which have already been tested as functional and provided with a rewiring or conductive tracks are used here.

The starting point is a chip 26 shown in FIG. 3a, which chip has already been tested as functional. A rewiring or conductive strip 27 and corresponding contact points 28 have already been produced at its contact-connecting side.

As shown in FIG. 3b, in order to produce the first lower chip arrangement, on a carrier 29, for example the passivated surface of a silicon wafer principally by means of a conductive polymer, a rewiring or conductive tracks 30 and rewiring or conductive contact points 31 are applied or principally printed on by using a conductive polymer. Then, see FIG. 3c, by means of a non-conductive adhesive 32, the chip 26 is adhesively bonded onto the carrier 29 with its contact-connecting side, that is to say the side having the conductive tracks 27. In this case, the chip-side tracks 27 and the contact points 28 are contact-connected to the corresponding tracks 30 and, respectively, the contact points 31 on the carrier 29. Once the connection has cured, then in the step according to FIG. 3e, material is removed from the chip 26, to form a thinner chip 26'. The material can be removed for example by dry or wet etching or a mechanical treatment. The structural height of the first chip arrangement is thus clearly reduced to a significant extent.

In the step according to FIG. 3f, the given configuration is embedded in a filling material 34 for the purpose of forming a holding frame 33. For this purpose, by way of example, insulating silicone is printed on and subsequently cured. The holding frame 33 has contact-connecting vias 35, which allow a later through-plating to the conductive tracks 30 and contact points 31 which are applied on the surface of the carrier 29. In step 3g, the surface of the holding frame 33, which also covers the chip, is then leveled by dry or wet etching or by mechanical treatment and the holding frame is made somewhat thinner.

In the step according to FIG. 3h, conductive or rewiring tracks 36 and rewiring or conductive points for the next chip arrangement are then produced by printing on a conductive polymer. The conductive polymer clearly fills the contact-connecting vias 35, so that through-plating to the underlying rewirings is effected.

Afterward, in the step according to FIG. 3i, a non-conductive adhesive 32a is again applied, after which, in the step according to FIG. 3j, a further or additional chip 26a is emplaced and adhesively bonded on with its contact-connecting side pointing downward. Here, too, during adhesive bonding, the conductive track 27a is contact-connected to the corresponding tracks 36 on the surface of the lower chip arrangement 37.

After the adhesive bonding of the chip 26a (see FIG. 3k), the chip 26a is processed (see FIG. 3l) to also produce a thinned chip 26a'. This is again followed by embedding in a filling material for the purpose of producing the holding frame with the contact-connecting vias and renewed production of the rewiring or conductive tracks, as described in FIGS. 3f–3h.

Once the entire configuration has been constructed, the result is a stack of chip arrangements 37 as is shown in FIG. 3m. Here, too, four chip arrangements 37 are stacked one above the other in an exemplary fashion. The individual components are subsequently singulated by separation of the holding frames, which, as in all the embodiments, of course, lie congruently one above the other. FIG. 3m shows a singulated component 38. Afterward, in step 3n, connecting adhesive points 39 are applied on the uncovered top side of the component 38 using a conductive adhesive. The component 38, by means of the connecting adhesive points 39, is subsequently adhesively bonded onto, and contact-connected to, a component carrier 40, on whose top side there are carrier-side contact points 41 (see FIG. 3o).

FIGS. 4a–4j show a fourth method variant for producing a component according to the invention. In this arrangement, the rewiring or conductive tracks of two chips lying one above the other are directly connected to one another.

Figure 4A:
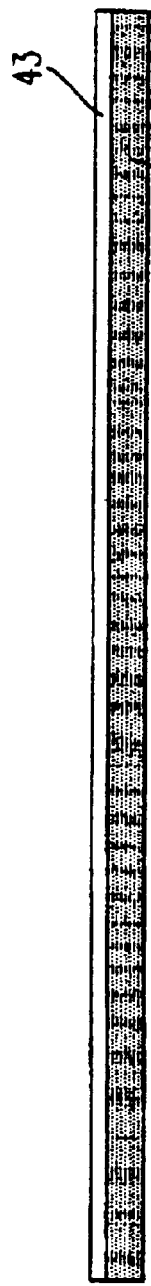
FIGS. 4a–4j show the method steps for producing a component in which the rewiring tracks of two chips are directly contact-connected to one another.
Figure 4B:

As shown in FIG. 4a, a non-conductive polymer layer 43 is printed or spun onto a carrier 42, which may be a film or a glass substrate. Afterward, as shown in FIG. 4b, a chip 44 is applied to the polymer layer 43, which is preferably adhesive on the top side, and then the polymer layer 43 is cured.

Figure 4C:
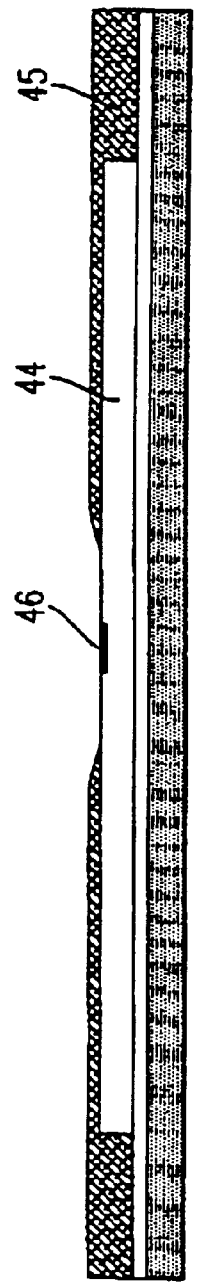
Figure 4D:
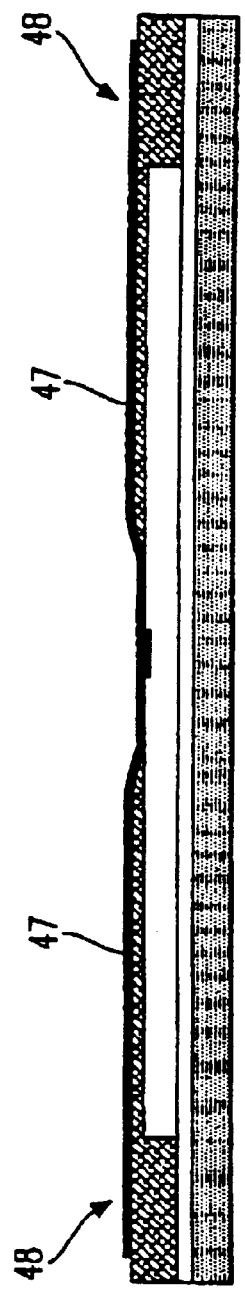
Figure 4E:
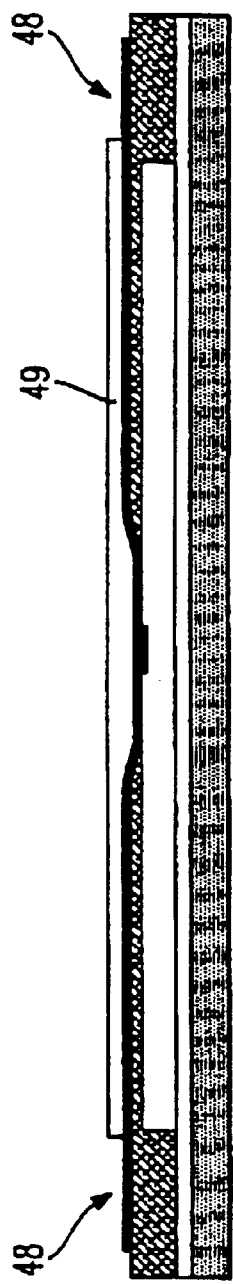
Figure 4F:
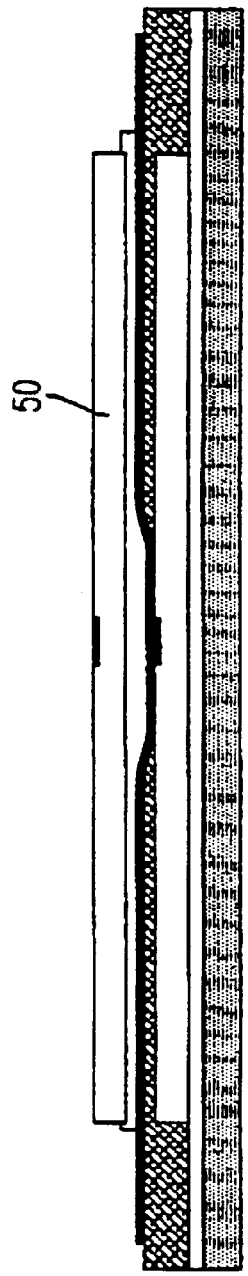

As shown in FIG. 4c, a filling agent 45 is subsequently applied and cured for the purpose of forming a holding frame which covers the chip 44 both laterally and clearly on the top side except for the region of the contact pads 46. As shown in FIG. 4d, the rewiring or conductive tracks 47 are subsequently produced, and clearly extend into the region of the lateral edges of the holding frame sections. In this case, the ends of the rewiring tracks 47 form contact elements 48, which serve for the subsequent contact-connection to a chip arrangement that is to be arranged thereabove.

A non-conductive adhesive 49 is then applied by a printing method, for example, onto the arrangement known from FIG. 4d. This adhesive layer is dimensioned in such a way that the contact elements 48, formed by the ends of the track 47, remain free. A second chip 50 is then adhesively bonded onto the layer 49 (see FIG. 4f). Then, the layer 49 is cured.

Figure 4G:
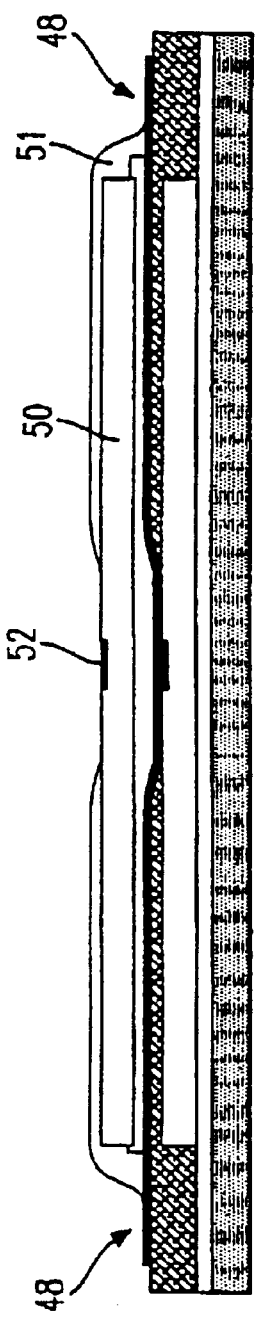

In the step shown in FIG. 4g, a further or additional filling agent 51 is then applied to form a layer, which embeds the second chip 50, both laterally and on the top side except for the region of the contact pads 52. This holding frame is also dimensioned laterally in such a way that the contact elements 48 of the tracks 47 of the chip planes situated underneath still remain free. The filling agent can be applied for example by a printing method.

Figure 4H:
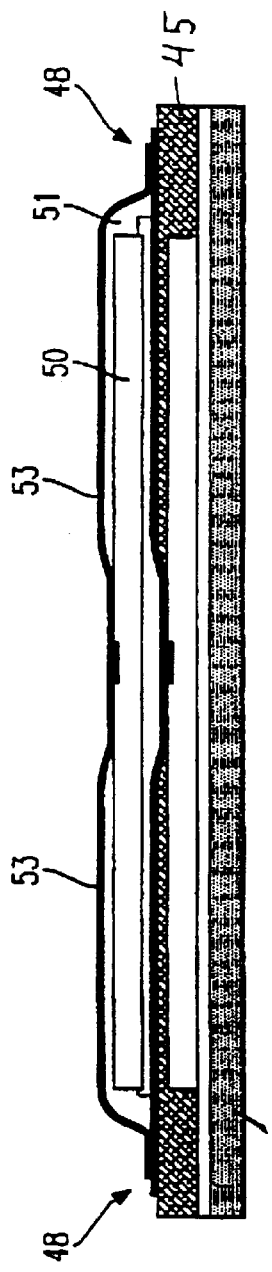

As shown in FIG. 4h, the rewiring or conductive tracks 53 of the chip 50 are produced. The tracks 53 run laterally over the holding frame downward into the track plane of the chip 44, where they are clearly contact-connected to the contact elements 48, that is to say the ends of the tracks 47. The rewiring or conductive tracks, like the conductive tracks of the underlying chip plane as well, can be produced by sputtering and plating and then formed by suitable photo-lithographic steps.

Figure 4I:
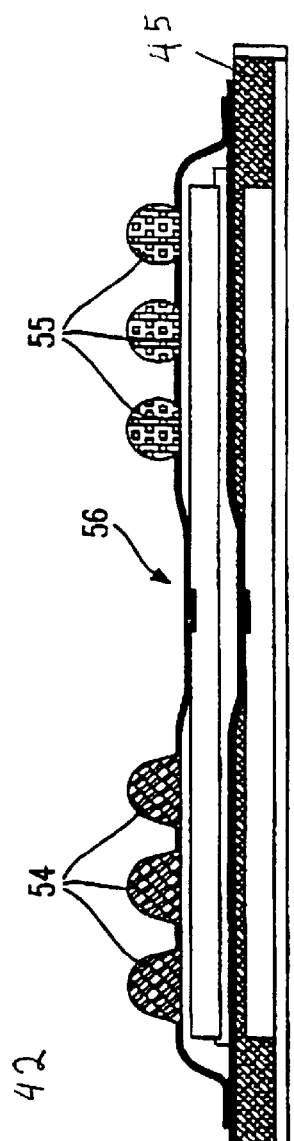
Figure 4J:
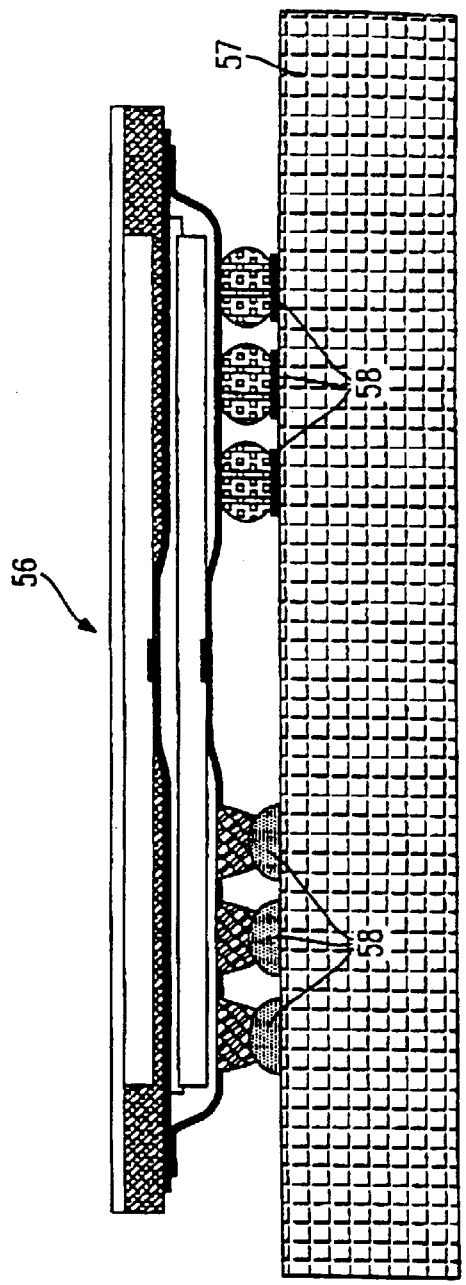

As shown in FIG. 4i, contact elements 54 and 55 are subsequently produced at the active side of the chip 50. The contact elements 54 are conductive interconnect elements that are to be adhesively contact-connected, and the contact elements 55 are solder balls in the shown example. Of course, it is also possible to provide only one type of contact elements. They serve to produce the subsequent contact to a carrier.

The carrier 42 is finally removed and the individual multichip modules are singulated or separated to form singulated components 56 by sawing (see the lateral sawing gaps indicated) or the like. The singulation is effected by separation in the region of the lower holding frame 45, and this can also be effected for example by laser cutters or the like.

Afterward, the component 56 can be fixed and contact-connected by means of the contact elements 54, 55 to a module board 57, on whose top side contact points 58 are provided. In the case of the contact elements 54, this is done using a conductive adhesive; the contact elements 55 are melted in a customary soldering process, thereby producing the electrical contact.

It should be pointed out at this juncture that FIGS. 4a–4j show the production of a multichip component 56 with two chips. It goes without saying that it is also possible to stack a plurality of chips one above the other, the rewiring or conductive tracks of the chips in each case being led from top to bottom into the plane of the tracks 47 of the bottom-most chip 44. It is also conceivable, however, for each rewiring or conductive track plane only to be contact-connected to the underlying plane, so that it is not necessary for the tracks to be led downward to an excessive extent laterally along the chip stack. The lateral dimensioning of the respective chip frames is enlarged somewhat, however, in the case of these embodiments.

Although various minor modifications may be suggested by those versed in the art, it should be understood that we wish to embody within the scope of the patent granted hereon all such modifications as reasonably and properly come within the scope of our contribution to the art.

We claim:

1. A method for producing an electrical component with a plurality of chips, which are stacked one above the other and contact-connected to one another, said component being mounted on a component carrier and being contact-connected on the component carrier by a plurality of contact elements provided on the component, said method comprising the steps of producing a first planar chip arrangement by arranging functional chips spaced apart from one another in a grid and filling at least spacings between the chips with a filling agent for the purpose of forming an insulating holding frame that fixes the chips with a chip-dedicated contact-connecting element which serves for the electrical contact-connection to another chip of another chip arrangement, said chip-dedicated contacting elements being provided in the region of the holding frame and having chip-dedicated conductive strips extending thereto; producing at least one additional planar chip arrangement according to the steps for producing the first planar chip arrangement; forming a stack of the planar chip arrangement including the first planar chip arrangement and all of the additional planar chip arrangements by arranging each additional chip arrangement on the first chip arrangement, so that the chips and the holding frames of the chip arrangements lie one above another and the respective contact-connection elements of the chip arrangements are connected to one another for the electrical chip-to-chip contact-connection; and then separating the components, each comprising a plurality of the chips of the individual chip arrangements by separating of the holding frames of the chip arrangements that are fixedly connected to one another.

2. A method according to claim 1, wherein the step of forming the first planar chip arrangement producing the first planar chip arrangement includes providing a carrier having adhesive means on which the functional chips spaced apart from one another are secured.

3. A method according to claim 2, wherein the carrier having adhesive means is selected from a group consisting of a self-adhesive film, a self-adhesive tape and a silicon carrier having a passivated surface.

4. A method according to claim 2, wherein individual chip arrangements are produced separately and subsequently connect to one another.

5. A method according to claim 4, wherein the separate chip arrangements are produced by the following steps:
applying a contact-connecting element to a carrier at a predetermined position;
fixing chips on the carrier;
producing an insulating holding frame;
removing the carrier;
producing contact strips on the chip;
providing connecting adhesive points and then subsequently connecting two chip arrangements to one another by means of the connecting adhesive points.

6. A method according to claim 5, wherein the thickness of the holding frame is dimensioned so that the contact-connecting elements protrude from the holding frame.

7. A method according to claim 5, wherein the filling agent, for the purpose of forming the holding frame, also at least partially covers the chip on its free side to form a protective layer.

8. A method according to claim 5, wherein the chips have one side with contact pads, said chips are fixed on the carrier with the one side engaging the carrier, and the step of producing the conductive strips applies the strips to the side which is freed from the carrier.

9. A method according to claim 5, wherein the conductive adhesive used is a conductive adhesive which is applied to the contact-connecting elements that are uncovered on the side freed of the carrier.

10. A method according to claim 5, wherein, after the end of the stacking operation, a protective coating is applied to an uppermost chip arrangement.

11. A method according to claim 1, which includes conducting a second additional chip arrangement on the chip arrangement that is already present.

12. A method according to claim 11, wherein the additional chip arrangement is produced by the steps of:
producing additional contact-connecting elements of the additional chip arrangement on the contact-connecting elements of the lower chip arrangement that are uncovered on the top side;
applying the chips of the additional chip arrangement above, and preferably congruently, with the chips of the lower chip arrangement;
producing an insulating holding frame in such a way that the contact-connecting elements still protrude from the holding frame and the filling agent covers the chips on the top side, except for the chip-side contact pads and the filling agent forms an insulating layer; and
producing the conductive strips extending from the contact pad to the contact-connecting elements.

13. A method according to claim 12, wherein the first chip arrangement on which the additional chip arrangements are constructed is produced by the steps of:
producing a contact-connecting element of the first chip arrangement on the carrier;
applying the chips of the first chip arrangement;
producing an insulating holding frame so that the contact-connecting elements still protrude from the holding frame and the filling agent covers the chips on the top side, except for the chip-side contact pads, said filling agent forming an insulating layer; and
producing the conductive strips.

14. A method according to claim 12, wherein, after the step of producing the holding frame including the frame section that partially covers the chips, conducting a cleaning step that uniformly removes a surface portion of the filling material.

15. A method according to claim 11, wherein a first chip arrangement is produced by the following steps:
producing conductive tracks with contact-connecting points on a carrier;
fixing the chips that are already provided with conductive strips on one side, with the one side facing the carrier, so that the conductive strips are connected to conductive tracks on the carrier;
producing a holding frame in such a way that the chips are also embedded in the filling agent at the free side, and forming contact vias for through-plating to the underlying contact-connecting points in the holding frame;
producing additional conductive tracks with contacting points and elements which fill the contact vias.

16. A method according to claim 15, which includes, after fixing the chips, removing chip material in order to reduce the thickness of the chips.

17. A method according to claim 15, wherein the chips are fixed by means of a non-conductive adhesive.

18. A method according to claim 15, wherein, after the production of the last chip arrangement, contact elements for the contact-connecting of the component, which will be subsequently separated, are provided at the top side of said chip arrangement to enable contact-connecting to a carrier.

19. A method according to claim 11, which includes:
arranging chips on a carrier;
producing a hollow frame in such a way that the chips are embedded in the filling agent laterally and on the free side, except for a region that leaves contact pads free of the agent;
producing contact tracks which extend right into the region of the holding frame section situated between the chips, with ends of the contact tracks being positioned in such a way to form contact elements for a second chip arrangement that is subsequently constructed;
applying a non-conductive adhesive for fixing the chip of the second chip arrangement and for insulating from the underlying contact tracks in such a way that the contact elements of the first chip arrangement are uncovered;

applying chips for the second chip arrangement;

applying a non-conductive additional filling compound for the purpose of forming a holding frame in such a way that it covers the chips laterally and on the top side, except for the region of the contact-connecting pads, and said contact elements of the first chip arrangement remaining free; and producing contact tracks on the second chip arrangement, which are contact-connected on the ends to the contact elements of the first chip arrangement.

20. A method according to claim 1, wherein contact-connecting elements and conductive tracks and contact-connecting points are produced from a conductive polymer.

21. A method according to claim 1, wherein contact-connecting elements and also conductive tracks and the contact-connecting points are formed by printing conducting material on the surface.

22. A method according to claim 1, wherein a non-conductive polymer is used as a filling agent.

23. A method according to claim 20, wherein the filling agent is applied by a step selected from a group consisting of printing on, spraying on and spinning on.

24. A method according to claim 1, which, after producing the holding frame, includes reducing the thickness of the filling agent while, at the same time, leveling the area.

25. A method according to claim 24, wherein the step of reducing the thickness of the filling agent is selected from a group consisting of wet etching, dry etching and mechanical treatment.

26. A method according to claim 1, wherein at least two additional planar chip arrangements are formed, and the step of forming a stack assembles the remaining additional planar chip arrangements on the first additional chip arrangement applied on the first planar chip arrangement and the stack subsequently has interconnect elements applied to an upper surface and is subsequently assembled on a component carrier prior to the step of separating.

* * * * *